United States Patent
Chou et al.

(10) Patent No.: US 7,956,415 B2
(45) Date of Patent: Jun. 7, 2011

(54) SOI TRANSISTOR HAVING A CARRIER RECOMBINATION STRUCTURE IN A BODY

(75) Inventors: Anthony I. Chou, Beacon, NY (US);
Andres Bryant, Burlington, VT (US);
Arvind Kumar, Beacon, NY (US);
Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 12/133,686

(22) Filed: Jun. 5, 2008

(65) Prior Publication Data
US 2009/0302386 A1 Dec. 10, 2009

(51) Int. Cl.
*H01L 27/12* (2006.01)
(52) U.S. Cl. ..................................................... 257/347
(58) Field of Classification Search .................. 257/349
See application file for complete search history.

(56) References Cited

U.S. PATENT DOCUMENTS

| | | | |
|---|---|---|---|
| 5,279,978 A * | 1/1994 | See et al. | 438/154 |
| 5,374,564 A | 12/1994 | Bruel | |
| 5,548,149 A * | 8/1996 | Joyner | 257/347 |
| 5,714,395 A | 2/1998 | Bruel | |
| 6,063,652 A * | 5/2000 | Kim | 438/155 |
| 6,300,218 B1 * | 10/2001 | Cohen et al. | 438/423 |
| 6,372,609 B1 | 4/2002 | Aga et al. | |
| 6,476,445 B1 * | 11/2002 | Brown et al. | 257/347 |
| 6,613,678 B1 | 9/2003 | Sakaguchi et al. | |
| 6,756,257 B2 * | 6/2004 | Davari et al. | 438/151 |
| 6,949,420 B1 * | 9/2005 | Yamashita | 438/149 |
| 7,081,399 B2 | 7/2006 | Maleville et al. | |
| 7,235,433 B2 * | 6/2007 | Waite et al. | 438/149 |
| 7,247,569 B2 * | 7/2007 | Boyd et al. | 438/699 |
| 2002/0056873 A1 * | 5/2002 | Wann | 257/336 |
| 2003/0230779 A1 * | 12/2003 | Park et al. | 257/349 |

* cited by examiner

*Primary Examiner* — N Drew Richards
*Assistant Examiner* — Grant S Withers
(74) *Attorney, Agent, or Firm* — Scully, Scott, Murphy & Presser, P.C.; H. Daniel Schnurmann (57) ABSTRACT

A top semiconductor layer is formed with two different thicknesses such that a step is formed underneath a body region of a semiconductor-on-insulator (SOI) field effect transistor at the interface between a top semiconductor layer and an underlying buried insulator layer. The interface and the accompanying interfacial defects in the body region provide recombination centers, which increase the recombination rate between the holes and electrons in the body region. Optionally, a spacer portion, comprising a material that functions as recombination centers, is formed on sidewalls of the step to provide an enhanced recombination rate between holes and electrons in the body region, which increases the bipolar breakdown voltage of a SOI field effect transistor.

15 Claims, 10 Drawing Sheets

SOI TRANSISTOR HAVING A CARRIER RECOMBINATION STRUCTURE IN A BODY

FIELD OF THE INVENTION

The present invention relates to semiconductor devices, and particularly, to semiconductor-on-insulator (SOI) field effect transistors (FETs) having a carrier recombination structure in a body, and methods of manufacturing the same.

BACKGROUND OF THE INVENTION

While semiconductor-on-insulator (SOI) field effect transistors offer faster operational speed than a bulk field effect transistor of comparable dimensions due to the reduction in capacitive coupling between the transistor and the underlying semiconductor substrate, SOI field effect transistors suffer from some adverse effects due to the presence of a floating body in the device structure. One manifestation of such adverse effects is an increased susceptibility to bipolar breakdown at a lower voltage compared with a bulk field effect transistor having similar dimensions.

Figure 1:
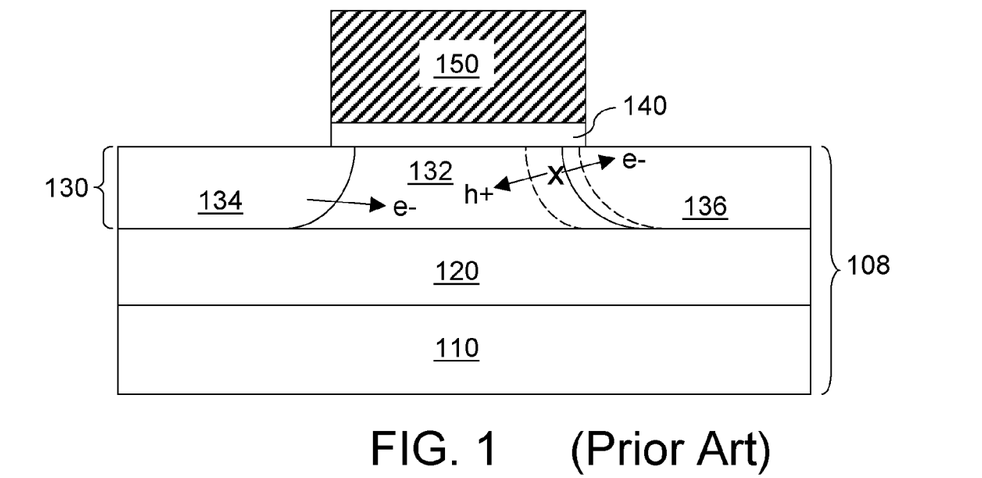
FIG. 1 is a vertical cross-sectional view of an exemplary prior art semiconductor-on-insulator (SOI) field effect transistor (FET) illustrating a mechanism for a bipolar breakdown.

Referring to FIG. 1, the mechanism of such an increase in the susceptibility to bipolar breakdown is illustrated for an exemplary prior art semiconductor-on-insulator (SOI) field effect transistor (FET). The exemplary prior art SOI FET comprises a semiconductor-on-insulator (SOI) substrate 108, a gate dielectric 140, and a gate electrode 150. The SOI substrate 108 comprises a handle substrate 110, a buried insulator layer 120, and a top semiconductor layer 130. The top semiconductor layer 130 comprises a body region 132, a source region 134, and a drain region 136. The body region 132 has a doping of a first conductivity type, which may be p-type or n-type, and the source region 134 and the drain region 136 have a doping of a second conductivity type, which is the opposite type of the first conductivity type. A depletion region, represented by the area between two dotted lines in the top semiconductor layer 130, is formed around the interface between the body region 132 and the drain region 136.

During the operation of the exemplar prior art SOI FET, a high drain electric field causes impact ionization in the depletion zone. At least one electron-hole pair is generated by the impact ionization, and the electron(s) and the hole(s) are attracted in opposite directions depending on the doping of the body region 132 and the drain region 136. For example, if the exemplary prior art SOI FET is an n-type field effect transistor, in which the body region 132 has a p-type doping and the drain region 136 has an n-type doping, holes from the impact ionization diffuse away from the drain region 136 into the body region 132 where the holes can accumulate, and electrons from the impact ionization diffuse away from the body region 132 and into the drain region 136, e.g., to the power supply, as illustrated in FIG. 1. Correspondingly, if the exemplary prior art SOI FET is a p-type field effect transistor, in which the body region 132 has an n-type doping and the drain region 136 has a p-type doping, electrons from the impact ionization diffuse away from the drain region 136 into the body region 132 and holes from the impact ionization diffuse away from the body region 132 and into the drain region 136, e.g., to the power supply.

In the case of an n-type SOI field effect transistor, the holes that accumulate in the body region 132 prior to flowing into the source region 134 raise the potential of the body region 132. As the p-n junction at the interface between the body region 132 and the source region 134 become forward biased, electrons are injected from the source region 134 into the body region 132, and travel to the depletion region at the interface between the body region 132 and the drain region 136. Additional electron-hole pairs are generated by impact ionization caused by these electrons. Additional holes are injected into the body region 132 and additional electrons are injected into the drain region 136. A positive feedback mechanism is set in motion, which results in bipolar breakdown of the exemplary prior art SOI FET. A similar mechanism may also cause bipolar breakdown in a p-type SOI field effect transistor, in which the polarity of charge carriers is reversed, i.e., holes replace electrons.

Figure 2:
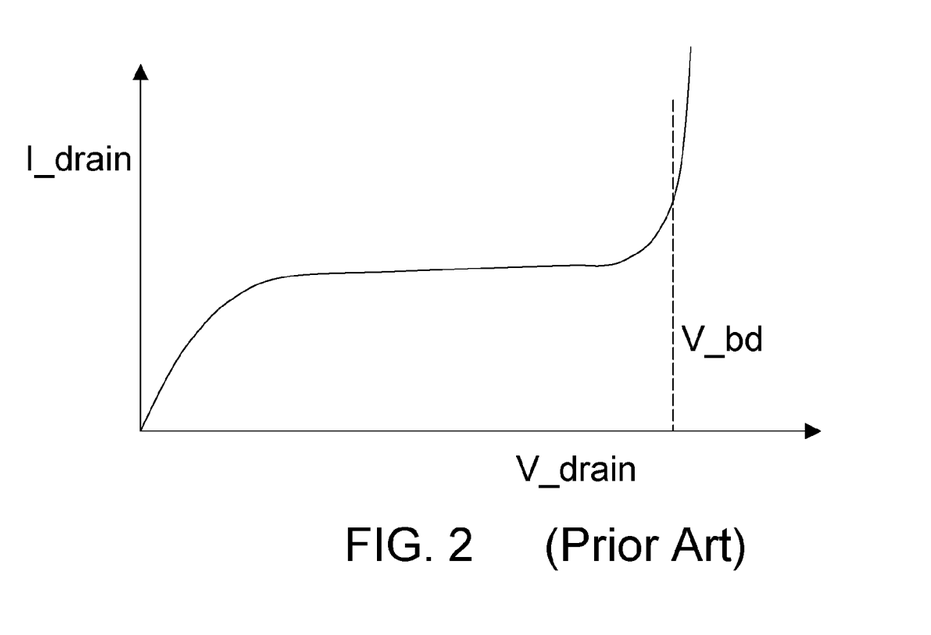
FIG. 2 is a graph showing a drain current (I_drain) as a function of drain voltage (V_drain) for the exemplary prior art SOI FET.

The response of a drain current (I_drain) as a function of a drain voltage (V_drain) while the exemplary prior art SOI FET is turned on is shown in FIG. 2. The drain current is substantially constant until the drain voltage reaches a certain value. At a critical value of the drain voltage, which is herein termed a "bipolar breakdown voltage" V_bd, the drain current increases abruptly due to the positive feedback mechanism described above. The bipolar breakdown voltage is lower for the exemplary prior art SOI FET compared with a bulk field effect transistor because charge carriers, e.g., holes, that accumulated in the exemplary prior art SOI FET cannot escape to any other node than into the source region 134, and consequently, tend to accumulate in the body region 132, while the charge carriers may flow into other portions of the substrate in the bulk field effect transistor formed in a bulk substrate. In other words, the floating body configuration of the exemplary prior art SOI FET prevents dissipation of the accumulated charge carriers from the initial impact ionization, while a conductive path between a body region and the bulk of the semiconductor substrate provided in a bulk field effect transistor dissipates accumulated charges from the initial impact ionization. Thus, lack of mechanism to dissipate the charge carriers that build up in the body region 132 in the exemplary prior art SOI FET causes reduction of the bipolar breakdown voltage relative to a bulk field effect transistor having similar dimensions.

Such a reduction in the bipolar breakdown voltage places a limitation on the operation of the exemplary prior art SOI FET. Particularly, in applications wherein a high drain voltage is required, the reduced bipolar breakdown voltage renders the exemplary prior art SOI FET severely disadvantaged relative to equivalent bulk field effect transistors. However, formation of bulk and SOI devices on the same substrate typically involves additional processing steps and increased manufacturing cost, let alone increases in the complexity of design and increased design cost.

In view of the above, there exists a need to provide an SOI field effect transistor having a high bipolar breakdown voltage, and methods of manufacturing the same.

SUMMARY OF THE INVENTION

The present invention addresses the need described above by providing an SOI field effect transistor having a step-wise recombination structure located in a body region.

According to the present invention, a top semiconductor layer is formed with two different thicknesses such that a step is formed underneath a body region of a semiconductor-on-insulator (SOI) field effect transistor at the interface between a top semiconductor layer and an underlying buried insulator layer. The interface and the accompanying interfacial defects in the body region provide recombination centers, which increase the recombination rate between the holes and electrons in the body region. Optionally, a spacer portion, comprising a material that functions as recombination centers, is formed on a sidewall of the step to provide an enhanced recombination rate between holes and electrons in the body region.

According to an aspect of the present invention, a semiconductor structure is provided, which comprises:

a top semiconductor layer including a first top semiconductor portion having a first thickness and a second top semiconductor portion having a second thickness and laterally abutting the first top semiconductor portion, wherein the first thickness is greater than the second thickness;

a field effect transistor comprising a body region including a portion of the first top semiconductor portion and a portion of the second semiconductor portion;

a buried insulator layer vertically abutting the top semiconductor layer; and a handle substrate vertically abutting the buried insulator layer.

A portion of the first top semiconductor portion may underlie an edge of a gate electrode overlying the body region and a portion of the second semiconductor portion may underlie another edge of the gate electrode.

The buried insulator layer may comprise a substantially vertical step between one edge of a gate electrode overlying the body region and another edge of the gate electrode.

In one embodiment, the buried insulator layer comprises a first buried insulator portion having a third thickness and a second buried insulator portion having a fourth thickness, wherein fourth thickness is greater than the third thickness, wherein the first top semiconductor portion is located over an entirety of the first buried insulator portion, and wherein the second top semiconductor portion is located over the second buried insulator portion. A sum of the first thickness and the third thickness may be equal to a sum of the second thickness and the fourth thickness.

In another embodiment, the semiconductor structure comprises a spacer structure laterally abutting the sidewall of the top semiconductor layer and abutting the buried insulator layer. The spacer structure may comprise a semiconductor material, a metallic material, or an insulator material, wherein the spacer structure and the buried insulator layer have different compositions. The spacer structure may comprises a material selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, Ta, TaN, Ti, TiN, W, WN, Co, Ni, Pt, Al, Cu, silicon oxide, silicon nitride, and silicon oxynitride.

The field effect transistor may further comprise a drain region abutting a top surface of the second buried insulator portion. The semiconductor structure may further comprise a semiconductor oxide portion vertically abutting the second top semiconductor portion and the second buried insulator portion, wherein the field effect transistor further comprises a drain region abutting a top surface of the semiconductor oxide portion. The field effect transistor may further comprise a source region abutting a top surface of the first buried insulator portion. The field effect transistor may further comprise a source region located in the first top semiconductor portion and separated from a top surface of the first buried insulator portion, which abuts the body region.

The semiconductor structure may further comprise a semiconductor oxide portion vertically abutting the first top semiconductor portion and the first buried insulator portion, wherein the field effect transistor further comprises a source region abutting a top surface of the semiconductor oxide portion. The field effect transistor may further comprise a source region located in the first top semiconductor portion and a semiconductor oxide portion vertically abutting the first top semiconductor portion and the first buried insulator portion, wherein the source region is separated from a top surface of the semiconductor oxide portion by the body region.

According to another aspect of the present invention, a method of forming a semiconductor structure is provided, which comprises:

providing a semiconductor-on-insulator (SOI) substrate comprising a top semiconductor layer, a buried insulator layer, and a handle substrate, wherein the top semiconductor layer includes a first top semiconductor portion having a first thickness and a second top semiconductor portion having a second thickness and laterally abutting the first top semiconductor portion, wherein the first thickness is greater than the second thickness; and forming a field effect transistor including a body region, wherein the body region includes a portion of the first top semiconductor portion and a portion of the second semiconductor portion, and wherein an entirety of a top surface of the body region is substantially horizontal.

The method may further comprise forming a first semiconductor oxide portion directly on a surface of the first portion and a second semiconductor oxide portion directly on the second portion. The method may further comprise forming a drain region in the second top semiconductor portion. The drain region may abut a top surface of the second semiconductor oxide portion or a top surface of the second buried insulator portion. The method may further comprise forming a source region in the first top semiconductor portion. The source region may abut a top surface of the first semiconductor oxide portion or a top surface of the first buried insulator portion. Alternately, the source region may be separated from a top surface of the first semiconductor oxide portion or a top surface of the first buried insulator portion by the body region.

BRIEF DESCRIPTION OF THE DRAWINGS

FIG. 3 corresponds to a step of formation of a masking layer 33. FIG. 4 corresponds to a step of patterning of the masking layer 33. FIG. 5 corresponds to a step of etching of an exposed portion of a semiconductor substrate 31. FIG. 6 corresponds to a step of formation of a spacer layer 61. FIG. 7 corresponds to a step of formation of a spacer structure 60. FIG. 8 corresponds to a step of formation of semiconductor oxide portions (22A, 22B). FIG. 9 corresponds to a step of deposition of an insulator material layer 21. FIG. 10 corresponds to a step of planarization of the insulator material layer 21. FIG. 11 corresponds to a step of implantation of molecular or atomic hydrogen atoms. FIG. 12 corresponds to a step of bonding a handle substrate 10 with the insulator material layer 21. FIG. 13 corresponds to a step of cleaving a release substrate 70. FIG. 14 corresponds to a step of formation of a field effect transistor.

FIG. 15 corresponds to a step of formation of a semiconductor oxide layer 22. FIG. 15 corresponds to a step of deposition of an insulator material layer 21. FIG. 17 corresponds to a step of planarization of the insulator material layer 21.

DETAILED DESCRIPTION OF THE INVENTION

As stated above, the present invention relates to semiconductor structures including a flash memory gate stack, a metal gate structure, and a semiconductor gate structure, and methods of manufacturing the same, which are now described in detail with accompanying figures. It is noted that like and corresponding elements mentioned herein and illustrated in the drawings are referred to by like reference numerals. It is also noted that proportions of various elements in the accompanying figures are not drawn to scale to enable clear illustration of elements having smaller dimensions relative to other elements having larger dimensions.

Figure 3:
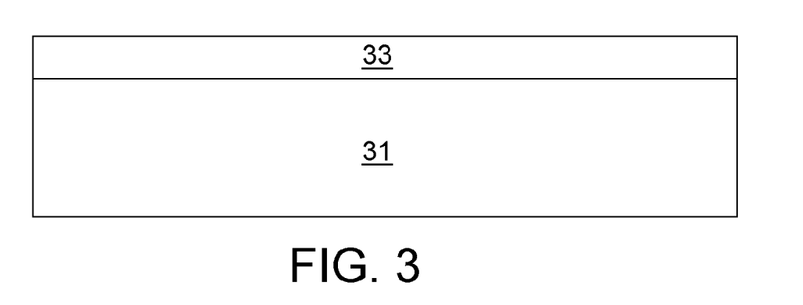
FIGS. 3-14 are sequential vertical cross-sectional views of a first exemplary semiconductor structure at various stages of a manufacturing sequence according to a first embodiment of the present invention.

Referring to FIG. 3, a first exemplary semiconductor structure according to a first embodiment of the present invention comprises a semiconductor substrate 31 and a masking layer 33 formed directly thereupon. The semiconductor substrate 31 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the entirety of the semiconductor substrate 31 is single crystalline, i.e., has the same set of crystallographic orientations throughout, or "epitaxial." The semiconductor substrate 31 may, or may not be doped with electrical dopants such as B, Ga, In, P, As, Sb, or a combination thereof. In case the semiconductor substrate 31 is doped, the dopant concentration of the semiconductor substrate 31 may be from about $1.0 \times 10^{15}/cm^3$ to about $1.0 \times 10^{19}/cm^3$, and typically from about $1.0 \times 10^{16}/cm^3$ to about $3.0 \times 10^{18}/cm^3$. The doping type of the semiconductor substrate 31 is herein referred to as a first conductivity type, which may be p-type or n-type.

The masking layer 33 may comprise a hard mask material or a soft mask material. Exemplary hard mask materials include dielectric oxides such as silicon oxide, dielectric nitrides such as silicon nitride, a semiconductor material different from the material of the semiconductor substrate 31 such that the semiconductor material may be subsequently removed selective to the semiconductor substrate 31, and a combination thereof. Soft mask materials are photosensitive materials that may be patterned by exposure to light and development without an etch. Exemplary soft mask materials include photoresists and photosensitive polyimides (PSPI).

Figure 4:
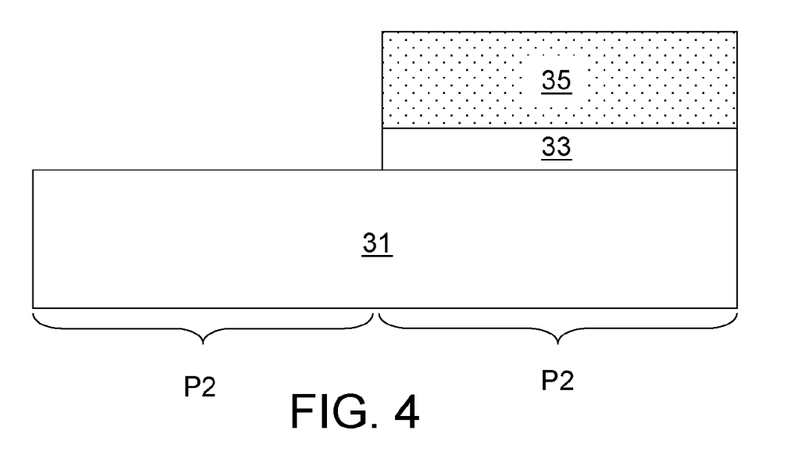

Referring to FIG. 4, the making layer 33 is patterned to expose a first portion P1 of the semiconductor substrate 31, while covering and protecting a second portion P2 of the semiconductor substrate 31. In case the masking layer 33 comprises a hard mask material, a photoresist 35 is applied and lithographically patterned. The pattern in the photoresist 35 is transferred into the masking layer 33 by an etch, which may be a dry etch or a wet etch. The photoresist 35 may be removed after patterning the masking layer 33. In case the masking layer 33 comprises a soft mask material, i.e., a photosensitive material, application and patterning of a photoresist is not necessary. Instead, the masking layer 33 is patterned by exposure to light and development.

Figure 5:
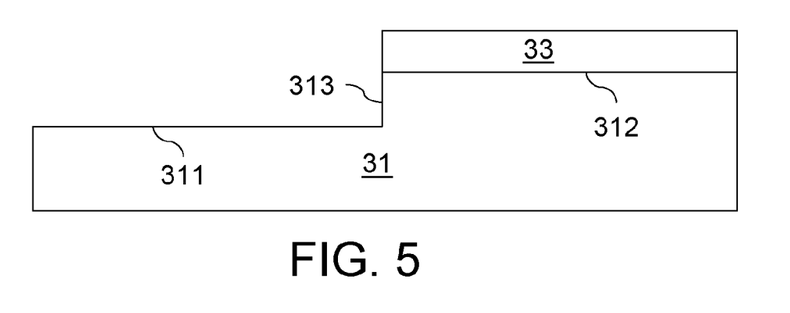

Referring to FIG. 5, the pattern in the masking layer 33 is transferred into the semiconductor substrate 31 by an etch, which may be a wet etch or a dry etch. The first portion P1 of the semiconductor substrate 31 is recessed, while the second portion P2 is protected by the masking layer 33, and consequently maintained without loss of any material. The second portion P1 is the complement of the first portion P1 within the semiconductor substrate 31. The recessing of the first portion P1 forms a first horizontal semiconductor surface 311 at a first height, a second horizontal semiconductor surface 312 at a second height, and a semiconductor sidewall surface 313 which is directly adjoined to the first horizontal semiconductor surface 311 and the second horizontal semiconductor surface 312. The first horizontal semiconductor surface 311 and the second horizontal semiconductor surface 312 are vertically offset, i.e., the first height and the second height are different. The semiconductor sidewall surface 313 may, or may not be substantially vertical. In case an anisotropic dry etch is employed, the semiconductor sidewall surface 313 is substantially vertical. In case a wet etch is employed, the semiconductor sidewall surface 313 may have a curvature due to the isotropic nature of the wet etch. The vertical offset between the first horizontal semiconductor surface 311 and the second horizontal semiconductor surface 312 may be from about 5 nm to about 300 nm, and typically from about 20 nm to about 100 nm, although lesser and greater vertical offsets are contemplated herein also. The masking layer 33 is subsequently removed.

Figure 6:
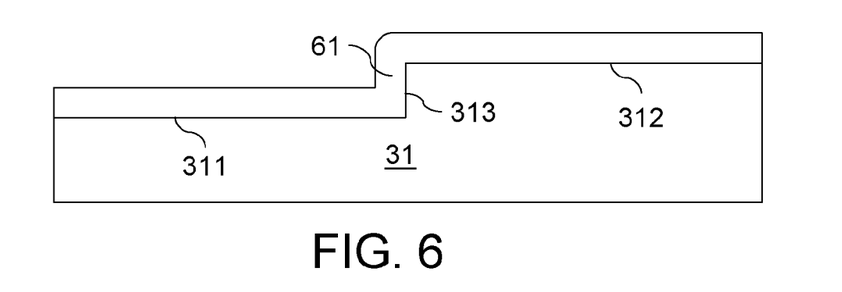

Referring to FIG. 6, a spacer layer 61 is deposited over the semiconductor substrate 31 directly on the first horizontal semiconductor surface 311, the second horizontal semiconductor surface 312, and the semiconductor sidewall surface 313. The spacer layer 61 may comprise a semiconductor material, a metallic material, or an insulator material. The spacer layer 61 may comprise a polycrystalline material or an amorphous material.

In case the spacer layer 61 comprises a semiconductor material, exemplary materials for the spacer layer 61 include, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials. The spacer layer 61 may comprise a polycrystalline semiconductor material or an amorphous semiconductor material. Alternately, the spacer layer 61 may comprise an epitaxial single crystalline semiconductor material having an epitaxial registry with the crystal structure of the semiconductor substrate 31 and having a composition different from the composition of the semiconductor substrate 31. For example, the semiconductor substrate 31 may comprise silicon and the spacer layer 61 may comprise a silicon germanium alloy.

In case the spacer layer 31 comprises a metallic material, exemplary materials for the spacer layer 61 include, but are not limited to Ta, TaN, Ti, TiN, W, WN, Co, Ni, Pt, Al, and Cu. In case the spacer layer 31 comprises an insulator material, exemplary materials for the spacer layer 61 include, but are not limited to, a dielectric oxide such as silicon oxide and dielectric metal oxides, a dielectric nitride such as silicon nitride and dielectric metal nitrides, and a dielectric oxynitride such as silicon oxynitride and dielectric metal oxynitrides. The dielectric metal oxides include materials that are commonly known as high-k dielectric materials such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, in which each value of x is independently from about 0.5 to about 3 and each value of y is independently from 0 to about 2.

The spacer layer 61 may be formed by chemical vapor deposition such as low pressure chemical vapor deposition (LPCVD), rapid thermal chemical vapor deposition (RTCVD), plasma enhanced chemical vapor deposition (PECVD), high density plasma chemical vapor deposition (HDPCVD), physical vapor deposition (PVD), atomic layer deposition (ALD), etc. The deposition process employed for forming the spacer layer 61 may be conformal or non-conformal. The thickness of the spacer layer 61, as measured on the semiconductor sidewall surface 313, may be from about 1 nm to about 100 nm, and typically from about 5 nm to about 20 nm, although lesser and greater widths are contemplated herein also.

Figure 7:
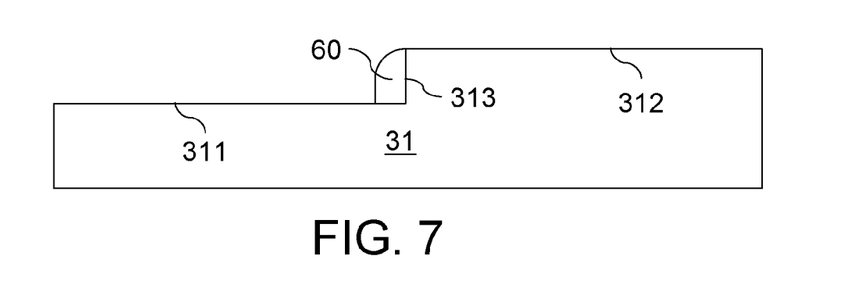

Referring to FIG. 7, an anisotropic etch is performed to remove horizontal portions of the spacer layer 61, thereby forming a spacer structure 60 from the portion of the spacer layer 61 that remains on the semiconductor sidewall surface 313. The first horizontal semiconductor surface 311 and the second horizontal semiconductor surface 312 are exposed by the anisotropic etch. Not necessarily but preferably, the anisotropic etch is selective to the semiconductor substrate 31. The spacer structure may, or may not, comprise a pair of substantially vertical parallel sidewalls. The width of the spacer structure 60, as measured on the semiconductor sidewall surface 313, may be from about 1 nm to about 100 nm, and typically from about 5 nm to about 20 nm, although lesser and greater widths are contemplated herein also.

Figure 8:
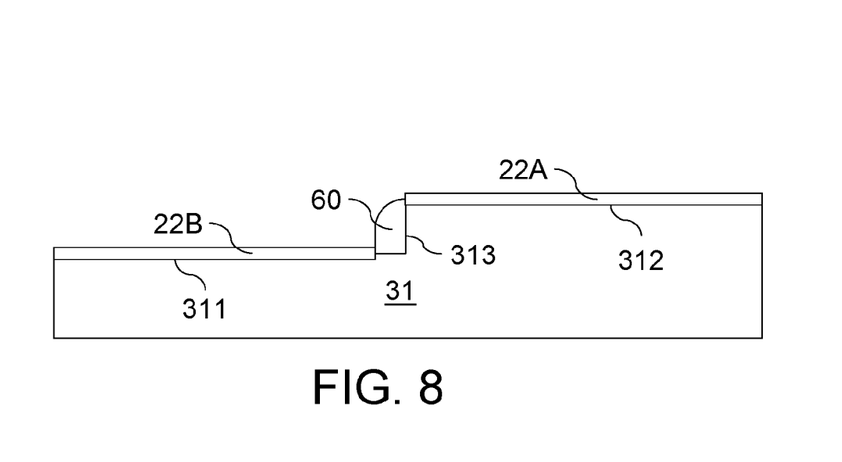

Referring to FIG. 8, a semiconductor oxide is formed on the first horizontal semiconductor surface 311 and the second horizontal semiconductor surface 312 by oxidation of the exposed semiconductor material on the first horizontal semiconductor surface 311 and the second horizontal semiconductor surface 312. A first semiconductor oxide portion 22A is formed on the second horizontal semiconductor surface 312, and a second semiconductor oxide portion 22B is formed on the first horizontal semiconductor surface 311. The first and second semiconductor oxide portions (22A, 22B) comprise an oxide of the semiconductor material of the semiconductor substrate 31. For example, if the semiconductor substrate 31 comprises silicon, the first and second semiconductor oxide portions (22A, 22B) may comprise silicon oxide. If the semiconductor substrate 31 comprises a silicon germanium alloy, the first and second semiconductor oxide portions (22A, 22B) may comprise silicon germanium oxide, i.e., a mixture of silicon oxide and germanium oxide. The first and second semiconductor oxide portions (22A, 22B) may be formed by thermal oxidation, plasma oxidation, etc. The first and second semiconductor oxide portions (22A, 22B) have a constant thickness throughout, i.e., the first and second semiconductor oxide portions (22A, 22B) have the same thickness, which may be from about 1 nm to about 60 nm, and preferably from about 3 nm to about 20 nm, although lesser and greater thicknesses are contemplated herein also.

Figure 9:
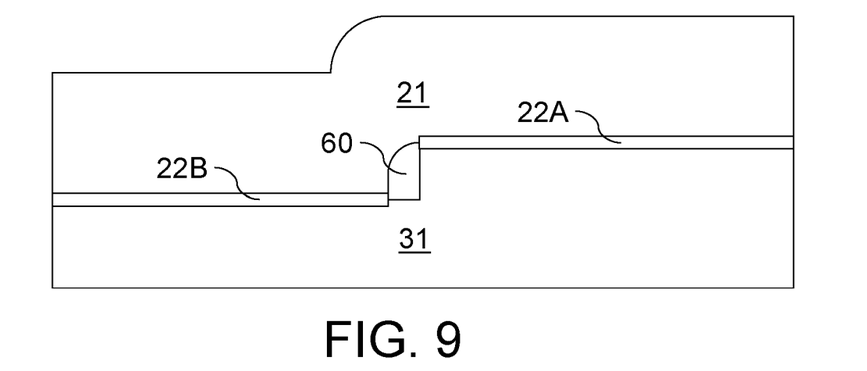

Referring to FIG. 9, an insulator material layer 21 is deposited on the first and second semiconductor oxide portions (22A, 22B) and the spacer structure 60. The insulator material layer 21 has a different composition than the spacer structure 60. The insulator material may comprise a dielectric oxide, a dielectric nitride, or a dielectric oxynitride. For example, the insulator material may comprise silicon oxide. The insulator material layer 21 may be formed by chemical vapor deposition such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc. The deposition process employed for forming the insulator material layer 21 may be conformal or non-conformal. The thickness of the insulator material layer 21, as measured over a horizontal surface, may be from about 20 nm to about 600 nm, and typically from about 50 nm to about 300 nm, although lesser and greater widths are contemplated herein also.

Figure 10:
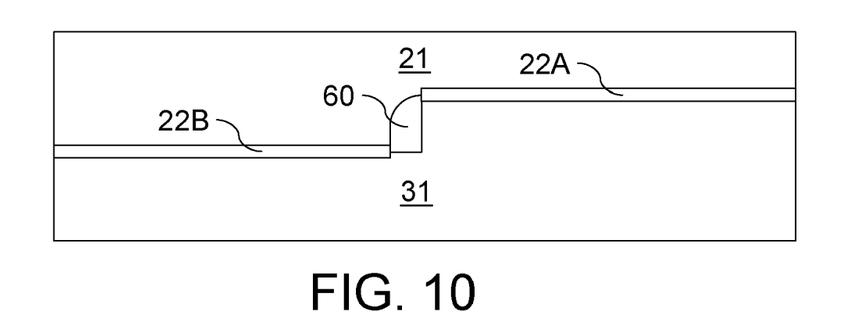

Referring to FIG. 10, a top surface of the insulator material layer 21 is planarized, for example, by chemical mechanical planarization (CMP). Additional disposable layers may be formed to facilitate the planarization of the insulator material layer 21. At the end of the planarization process, the portion of the insulator material layer 21 over the first semiconductor oxide portion 22A has a thickness from about 15 nm to about 450 nm, although lesser and greater thicknesses are contemplated herein also. The portion of the insulator layer 21 over the second semiconductor oxide portion 22B has a thickness from about 20 nm to about 500 nm at this point, although lesser and greater thicknesses are also contemplated herein.

Figure 11:
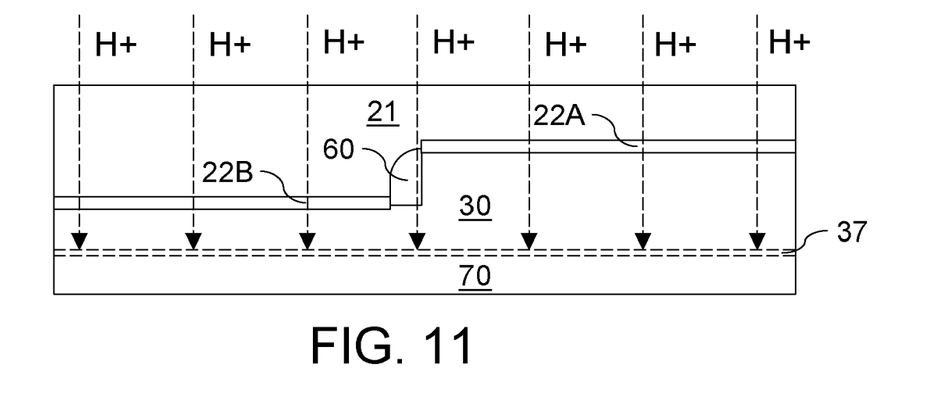

Referring to FIG. 11, molecular hydrogen ions ($H_2^+$) or atomic hydrogen ions (He) are implanted into the first semiconductor substrate into a depth that exceeds the depth of the first semiconductor oxide portion 22A to form a hydrogen implanted layer 37. The semiconductor substrate 31 is separated into a top semiconductor layer 30 and a release substrate 70. The top semiconductor layer 30 is located between the hydrogen implanted layer 37 and the set of the first and second semiconductor oxide portions (22A, 22B) and the spacer structure 60. The release substrate 70 is located below the hydrogen implanted layer 37. Processes and conditions for forming the hydrogen implantation layer 37 are well known to those skilled in the art. For example, the various separation by hydrogen implantation processes and conditions described in U.S. Pat. Nos. 5,374,564 and 5,714,395 to Bruel, 6,372,609 to Aga et al., 6,613,678 to Sagaguchi et al., and 7,081,399 to Maleville et al. may be employed, the entire contents of which are incorporated herein by reference.

Figure 12:
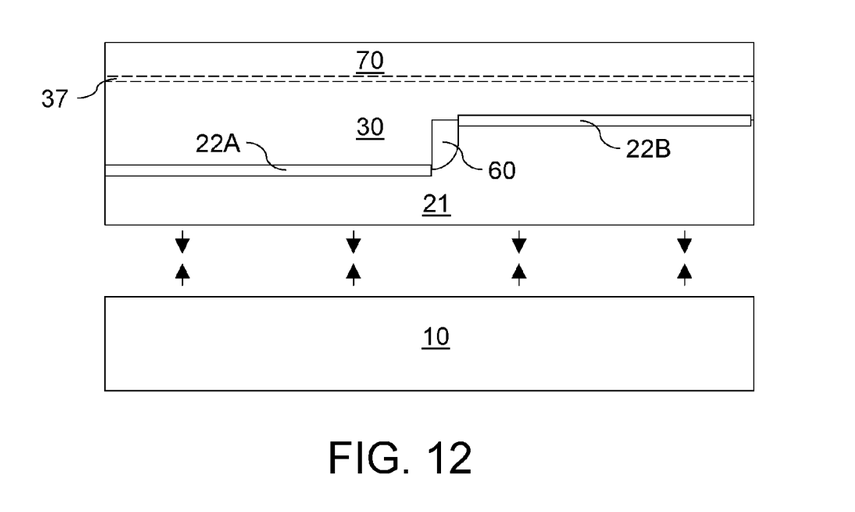

Referring to FIG. 12, a handle substrate 10 is brought into contact with the exposed surface, which is flat at this point, of the insulator material layer 21. The handle substrate 10 is subsequently bonded to the insulator material layer 21 by methods known in the art. For example, after being place in contact with each other, the handle substrate 10 and the insulator material layer 21, as well as the top semiconductor layer 30 and the release substrate 70 attached thereto, are annealed to promote adhesion of the insulator material layer 21 to the handle substrate 10. The handle substrate 10 may comprise a semiconductor material, a metallic material, or an insulator material. For example, the handle substrate 10 may comprise silicon.

Figure 13:
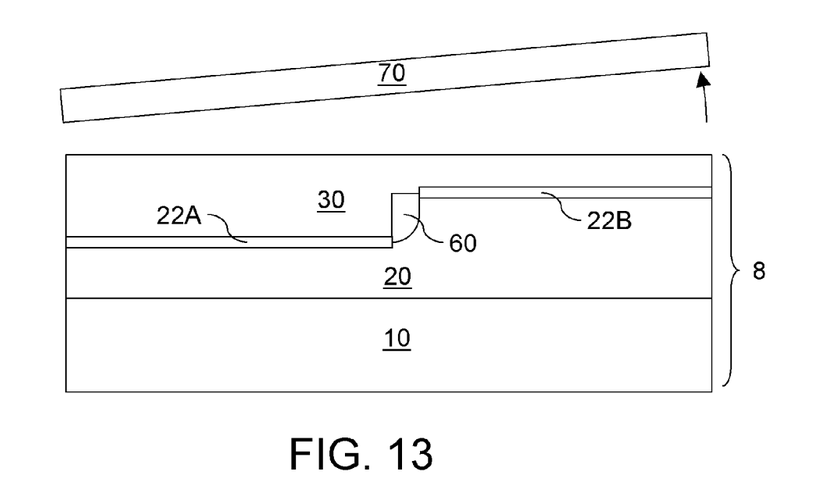

Referring to FIG. 13, subsequent to, or concurrently with, the bonding of the handle substrate 10 with the insulator material layer 21, the release substrate 70 is cleaved from the top semiconductor layer 30 at the hydrogen implanted layer 37. The top semiconductor layer 30, the insulator material layer 21, the handle substrate 10, and the set of the first and second semiconductor oxide portions (22A, 22B) and the spacer structure 60 collectively constitute a semiconductor-on-insulator (SOI) substrate 8. The insulator material layer 21 is hereafter referred to as a "buried insulator layer" 20 since the insulator material layer 21 is buried within the SOI substrate between the top semiconductor layer 30 and the handle substrate 10. The buried insulator layer 20 comprises a flat bottom surface which vertically abuts an entirety of the handle substrate 10. Methods of cleaving a bonded substrate by an anneal is well known in the art, and described, for example, in the above referenced U.S. patents on separation by hydrogen implantation processes and conditions.

Figure 14:
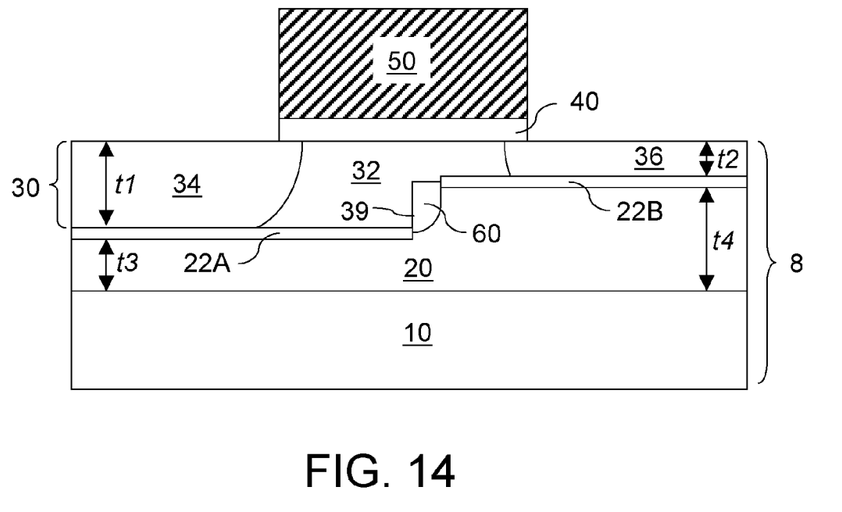

Referring to FIG. 14, the top semiconductor layer 30 comprise a first top semiconductor layer portion having a first thickness t1 and a second top semiconductor portion having a second thickness t2. The first thickness t1 is greater than the second thickness t2. The first thickness t1 may be from about 15 nm to about 250 nm, although lesser and greater thicknesses are contemplated herein also. The second thickness t2 may be from about 20 nm to about 300 nm at this point, although lesser and greater thicknesses are also contemplated herein.

Preferably, the entirety of the top semiconductor layer 30, including the first top semiconductor portion and the second top semiconductor portion, comprises a same semiconductor material, and is of integral construction. Preferably, entirety of the top semiconductor layer 30 is single crystalline. In this case, the first top semiconductor portion and the second top semiconductor portion may comprise the same material, may be of integral construction, and may be single crystalline.

Preferably, the entirety of the top semiconductor layer, including the first top semiconductor portion and the second top semiconductor portion, has a substantially coplanar and contiguous top surface. A gate dielectric 40 and a gate electrode 50 are formed over, and straddling, the first top semiconductor portion and the second semiconductor portion. The gate dielectric 40 and the gate electrode 50 may be formed by methods well known in the art such that the sidewalls of the gate dielectric 40 and the sidewalls of the gate electrode 50 are substantially vertically coincident.

Employing the gate electrode 50 as a self-aligned implant mask, dopants of a second conductivity type, which is the opposite of the first conductivity type, are implanted into the top semiconductor layer 30 to form a source region 34 in the first top semiconductor portion located directly on the first semiconductor oxide portion 22A and a drain region 36 in the second top semiconductor portion located directly on the second semiconductor oxide portion 22B. The remaining portion of the top semiconductor layer 30 between the source region 34 and the drain region 36 constitutes a body region 32. The body region 32 includes a portion of the first top semiconductor portion and a portion of the second semiconductor portion. The body region 32 has a doping of the first conductivity type. Thus, if the body region 32 has a p-type doping, the source region 34 and the drain region 36 have an n-type doping, and vice versa. The source region 34 abuts a top surface of the first semiconductor oxide portion 22A, and the drain region 36 abuts a top surface of the second semiconductor oxide portion 22B.

The buried insulator layer 20 comprises a first buried insulator portion having a third thickness t3 and a second buried insulator portion having a fourth thickness t4. The first buried insulator portion is located directly underneath the first semiconductor oxide portion 22A, and the second buried insulator portion is located directly underneath the second semiconductor oxide portion 22B. In other words, the first top semiconductor portion is located over an entirety of the first buried insulator portion, and the second top semiconductor portion is located over the entirety of the second buried insulator portion. The fourth thickness t4 is greater than the third thickness t3. The third thickness t3 may be from about 15 nm to about 450 nm, although lesser and greater thicknesses are contemplated herein also. The fourth thickness t4 may be from about 20 nm to about 500 nm at this point, although lesser and greater thicknesses are also contemplated herein. Since the thickness of the first semiconductor oxide portion 22A and the thickness of the second semiconductor oxide portion 22B are the same and the top surface of the top semiconductor layer 30 and the bottom surface of the buried insulator layer 20 are substantially horizontal, the sum of the first thickness t1 and the third thickness t3 is be equal to the sum of the second thickness t2 and the fourth thickness t4.

A sidewall 39 of the top semiconductor layer 30 is located at an edge of the first top semiconductor portion. The spacer structure 60 laterally abuts the sidewall 39 of the top semiconductor layer 30. The spacer structure 60 also abuts the buried insulator layer 20. The spacer structure 60 comprises the same material as the spacer layer 61 of FIG. 6, which may comprise a semiconductor material, a metallic material, or an insulator material as described above.

The spacer structure 60 provides recombination centers for holes and electrons that are injected into the body region 32 during operation of the field effect transistor in FIG. 14. The spacer structure 60 comprises a material different from the material of the top semiconductor layer 30 and the material of the buried insulator layer 20. The spacer structure 60 enhances recombination of holes and electrons by providing recombination centers within the spacer structure 60 caused by the material property of the spacer structure 60 and/or the crystalline defects induced within the body region near the sidewall 39, which is the interface between the body region 32 and the spacer structure 60. The crystalline defects include point defects and dislocations. By increasing the density of recombination centers near the body region 32, i.e., at the sidewall 39 attached to the body region 32, minority carriers injected from the source region recombine at or near the spacer structure 60, and thus do not reach the high-field drain regions, therefore the positive-feedback chain of bipolar action is broken, which increases the bipolar breakdown voltage for the inventive SOI field effect transistor.

Figure 15:
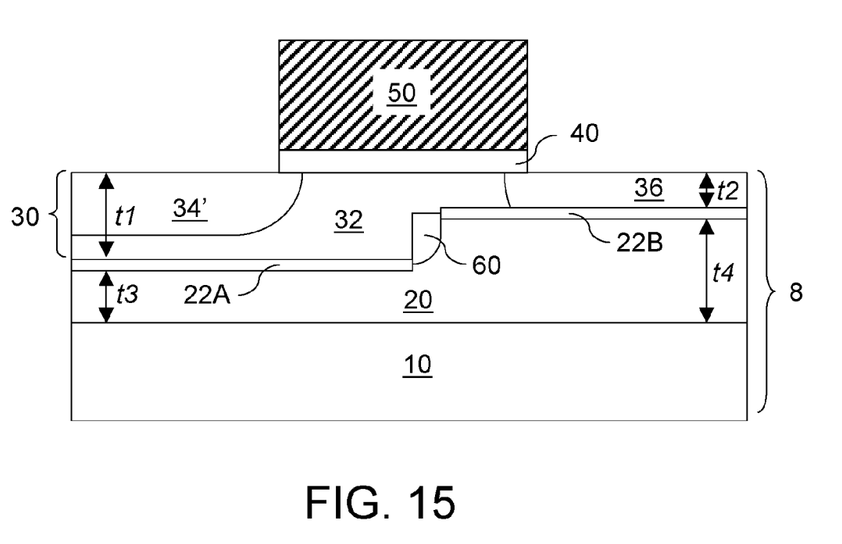
FIGS. 15, 16, and 17 are first, second, and third variations of the first exemplary semiconductor structure, respectively, according to the first embodiment of the present invention.

Referring to FIG. 15, a first variation of the first exemplary semiconductor structure is derived from the first exemplary semiconductor structure of FIG. 14 by modifying the ion implantation process employed to form the source region 34'. Specifically, the energy, and consequently, the implantation depth of the implanted ions are reduced such that the source region 34' does not extend to the top surface of the first semiconductor oxide portion 22A underneath the first top semiconductor portion of the top semiconductor layer 30. Thus, the source region 34' is separated from the first top semiconductor oxide portion 22A by the body region 32. The depth of the source region is greater than the second thickness t2, and is less than the first thickness t1.

Figure 16:
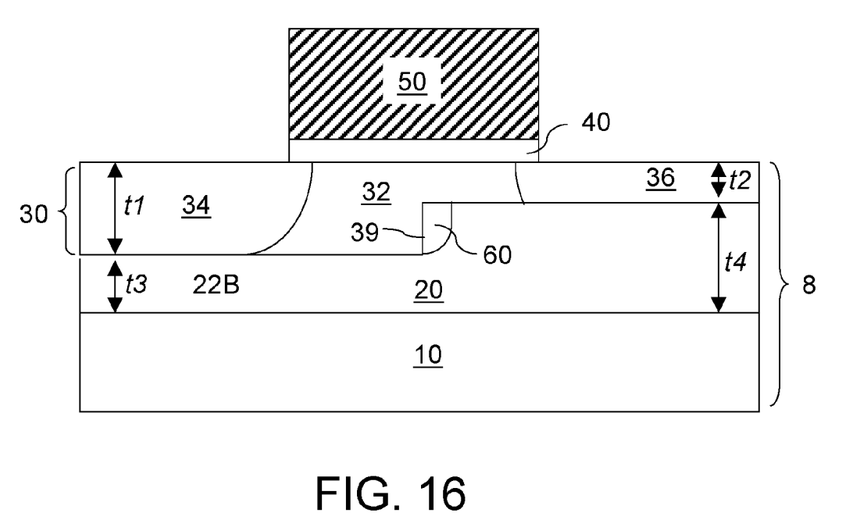

Referring to FIG. 16, a second variation of the first exemplary semiconductor structure is derived from the first exemplary semiconductor structure by omitting the processing step for formation of the first and second semiconductor oxide portions (22A, 22B) illustrated in FIG. 8. Thus, the dielectric material layer 21 is formed directly on the semiconductor substrate 31 at a processing step corresponding to FIG. 9. In this case, the first top semiconductor portion and the second top semiconductor portion within the top semiconductor layer 30 laterally abut each other directly above the sidewall 39 of the top semiconductor layer 30 between the body region 32 and the spacer structure 60.

Figure 17:
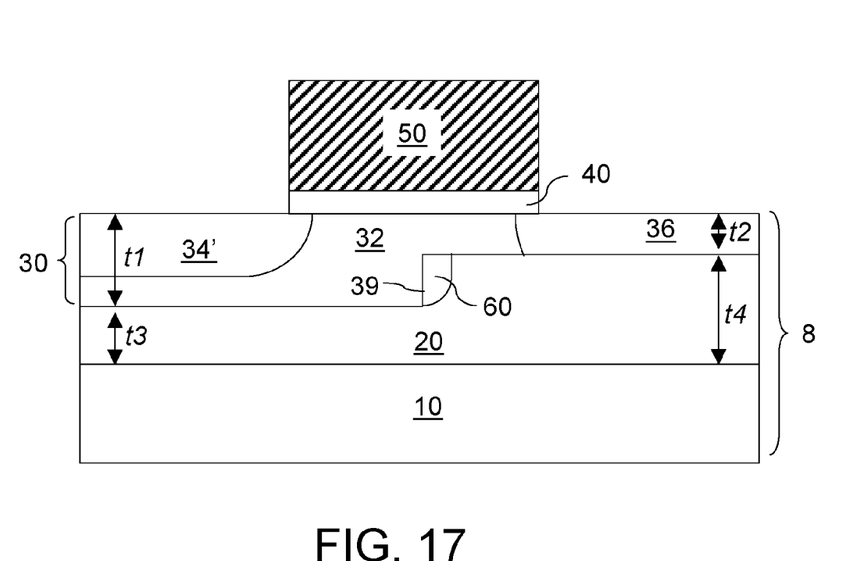

Referring to FIG. 17, a third variation of the first exemplary semiconductor structure is derived from the second exemplary semiconductor structure of FIG. 16 by modifying the ion implantation process employed to form the source region 34' in the same manner as in the first variation of the first exemplary semiconductor structure as illustrated in FIG. 15. The first top semiconductor portion and the second top semiconductor portion within the top semiconductor layer 30 laterally abut each other directly above the sidewall 39 of the top semiconductor layer 30 between the body region 32 and the spacer structure 60. The source region 34' is separated from the first top semiconductor oxide portion 22A by the body region 32. The depth of the source region is greater than the second thickness t2, and is less than the first thickness t1.

Figure 18:
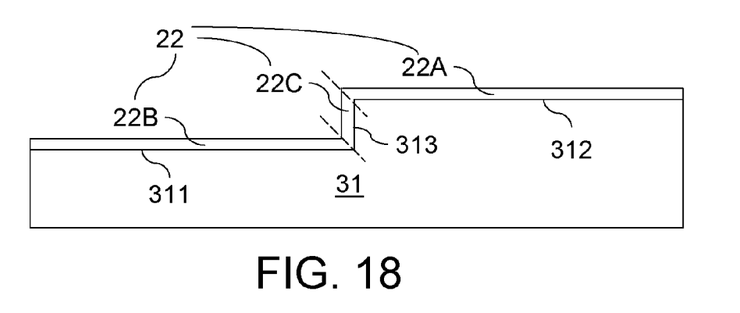
FIGS. 18-21 are sequential vertical cross-sectional views of a second exemplary semiconductor structure at various stages of a manufacturing sequence according to a second embodiment of the present invention.

Referring to FIG. 18, a second exemplary semiconductor according to a second embodiment of the present invention is derived from the first exemplary semiconductor structure of FIG. 5 by removing the masking layer 33 and forming a semiconductor oxide layer 22. The semiconductor oxide layer 22 is formed directly on the first horizontal semiconductor surface 311, the second horizontal semiconductor surface 312, and the semiconductor sidewall surface 313 by oxidation of the exposed semiconductor material of the semiconductor substrate 31. The semiconductor oxide layer 22 comprises a first semiconductor oxide portion 22A formed directly on the second horizontal semiconductor surface 312, a second semiconductor oxide portion 22B formed directly on the first horizontal semiconductor surface 311, and a sidewall semiconductor oxide portion 22C formed directly on the semiconductor sidewall surface 313. The semiconductor oxide layer 22 comprises an oxide of the semiconductor material of the semiconductor substrate 31. For example, if the semiconductor substrate 31 comprises silicon, the semiconductor oxide layer 22 may comprise silicon oxide. If the semiconductor substrate 31 comprises a silicon germanium alloy, the semiconductor oxide layer 22 may comprise silicon germanium oxide, i.e., a mixture of silicon oxide and germanium oxide. The semiconductor oxide layer 22 may be formed by thermal oxidation, plasma oxidation, etc. The semiconductor oxide layer 22 has a constant thickness throughout, which may be from about 1 nm to about 60 nm, and preferably from about 3 nm to about 20 nm, although lesser and greater thicknesses are contemplated herein also.

Figure 19:
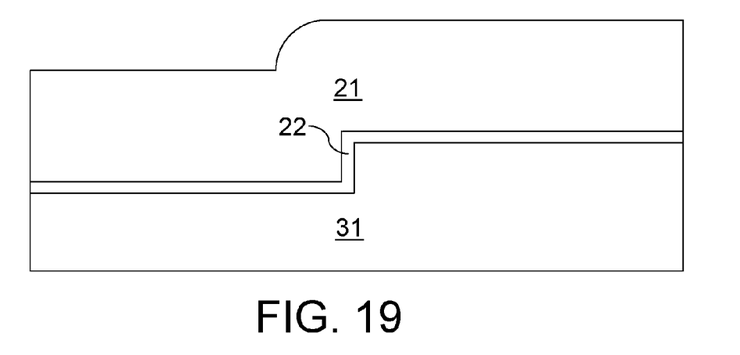

Referring to FIG. 19, an insulator material layer 21 is deposited on the semiconductor oxide layer 22. The insulator material layer 21 may comprise a dielectric oxide, a dielectric nitride, or a dielectric oxynitride. For example, the insulator material may comprise silicon oxide. The insulator material layer 21 may be formed by the same processing steps as in the first embodiment. The thickness of the insulator material layer 21 may be substantially the same as in the first embodiment.

Figure 20:
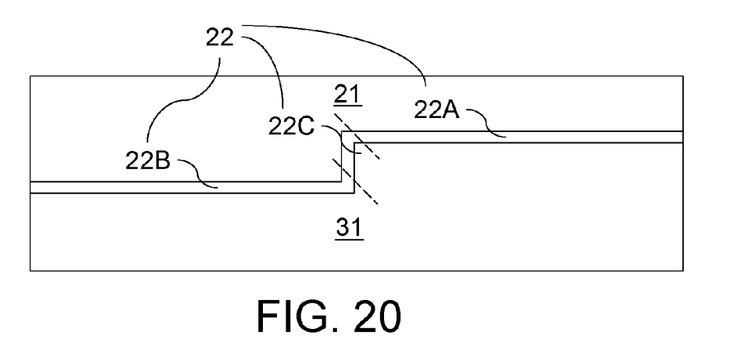

Referring to FIG. 20, a top surface of the insulator material layer 21 is planarized employing the same processing steps as in the first embodiment. At the end of the planarization process, the portion of the insulator material layer 21 over the first semiconductor oxide portion 22A has a thickness from about 15 nm to about 450 nm, although lesser and greater thicknesses are contemplated herein also. The portion of the insulator layer 21 over the second semiconductor oxide portion 22B has a thickness from about 20 nm to about 500 nm at this point, although lesser and greater thicknesses are also contemplated herein.

Figure 21:
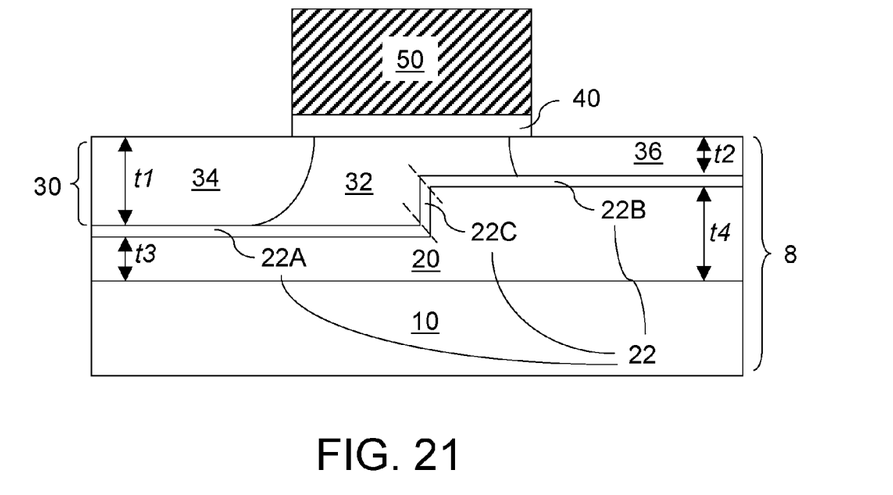

Processing steps corresponding to FIGS. 11-14 are performed to form an SOI substrate 8, and to form an SOI FET including a body region 32, a source region 34, a drain region 36, a gate dielectric 40, and a gate electrode 50, resulting in the second exemplary semiconductor structure of FIG. 21.

As in the first exemplary semiconductor structure of FIG. 14, the top semiconductor layer 30 comprise a first top semiconductor layer portion having a first thickness t1 and a second top semiconductor portion having a second thickness t2. The first thickness t1 is greater than the second thickness t2. The first thickness t1 may be from about 15 nm to about 250 nm, although lesser and greater thicknesses are contemplated herein also. The second thickness t2 may be from about 20 nm to about 300 nm at this point, although lesser and greater thicknesses are also contemplated herein.

Preferably, the entirety of the top semiconductor layer 30, including the first top semiconductor portion and the second top semiconductor portion, comprises a same semiconductor material, and is of integral construction. Preferably, entirety of the top semiconductor layer 30 is single crystalline. In this case, the first top semiconductor portion and the second top semiconductor portion may comprise the same material, may be of integral construction, and may be single crystalline. In the second exemplary semiconductor structure, the first top semiconductor portion laterally abuts the second top semiconductor portion at an interface located underneath, and within two substantially vertical edges of, the gate electrode 50.

Preferably, the entirety of the top semiconductor layer, including the first top semiconductor portion and the second top semiconductor portion, has a substantially coplanar and contiguous top surface. The gate dielectric 40 and the gate electrode 50 straddle the first top semiconductor portion and the second semiconductor portion. The gate dielectric 40 and the gate electrode 50 may be formed by methods well known in the art such that the sidewalls of the gate dielectric 40 and the sidewalls of the gate electrode 50 are substantially vertically coincident.

Employing the gate electrode 50 as a self-aligned implant mask, dopants of a second conductivity type, which is the opposite of the first conductivity type, are implanted into the top semiconductor layer 30 to form a source region 34 in the first top semiconductor portion located directly on the first semiconductor oxide portion 22A and a drain region 36 in the second top semiconductor portion located directly on the second semiconductor oxide portion 22B. The remaining portion of the top semiconductor layer 30 between the source region 34 and the drain region 36 constitutes the body region 32. The body region 32 includes a portion of the first top semiconductor portion and a portion of the second semiconductor portion. The portion of the second semiconductor portion within the body region 32 laterally abuts the portion of the top semiconductor portion included within the body region 32. The body region 32 has a doping of the first conductivity type. Thus, if the body region 32 has a p-type doping, the source region 34 and the drain region 36 have an n-type doping, and vice versa. The source region 34 abuts a top surface of the first semiconductor oxide portion 22A, and the drain region 36 abuts a top surface of the second semiconductor oxide portion 22B.

The buried insulator layer 20 comprises a first buried insulator portion having a third thickness t3 and a second buried insulator portion having a fourth thickness t4. The first buried insulator portion is located directly underneath the first semiconductor oxide portion 22A, and the second buried insulator portion is located directly underneath the second semiconductor oxide portion 22B. In other words, the first top semiconductor portion is located over an entirety of the first buried insulator portion, and the second top semiconductor portion is located over the entirety of the second buried insulator portion. The fourth thickness t4 is greater than the third thickness t3. The third thickness t3 may be from about 15 nm to about 450 nm, although lesser and greater thicknesses are contemplated herein also. The fourth thickness t4 may be from about 20 nm to about 500 nm at this point, although lesser and greater thicknesses are also contemplated herein. Since the thickness of the first semiconductor oxide portion 22A and the thickness of the second semiconductor oxide portion 22B are the same and the top surface of the top semiconductor layer 30 and the bottom surface of the buried insulator layer 20 are substantially horizontal, the sum of the first thickness t1 and the third thickness t3 is be equal to the sum of the second thickness t2 and the fourth thickness t4.

The interface between the body region 32 and the semiconductor oxide layer 20 as well as crystalline defects formed within the body region 32 near the interface with the semiconductor oxide layer provides recombination centers for holes and electrons that are injected into the body region 32 during operation of the field effect transistor in FIG. 21. The crystalline defects include point defects and dislocations. By increasing the density of recombination centers near the body region 32, minority carrier diffusion from the source to drain regions across the body is reduced, thereby reducing the rate of impact ionization and increasing the bipolar breakdown voltage for the inventive SOI field effect transistor.

Figure 22:
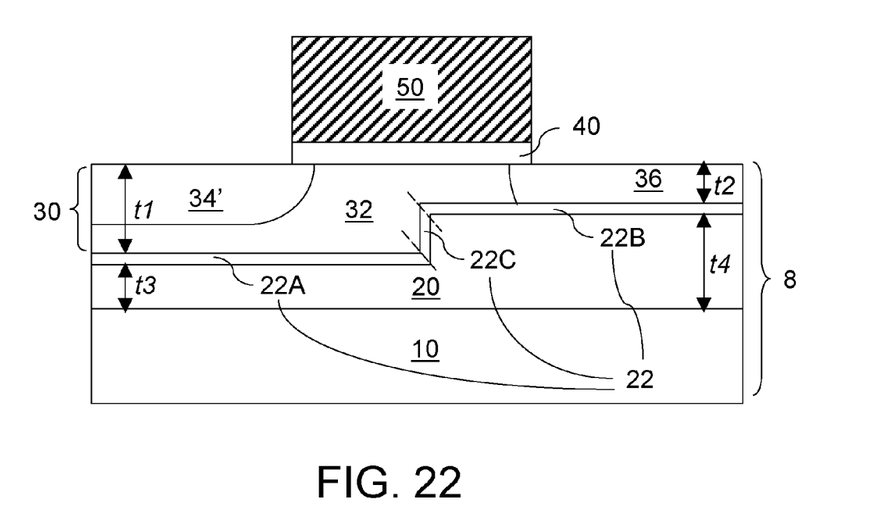
FIGS. 22, 23, and 24 are first, second, and third variations of the second exemplary semiconductor structure, respectively, according to the second embodiment of the present invention.

Referring to FIG. 22, a first variation of the second exemplary semiconductor structure is derived from the second exemplary semiconductor structure of FIG. 21 by modifying the ion implantation process employed to form the source region 34'. Specifically, the energy, and consequently, the implantation depth of the implanted ions are reduced such that the source region 34' does not extend to the top surface of the first semiconductor oxide portion 22A underneath the first top semiconductor portion of the top semiconductor layer 30. Thus, the source region 34' is separated from the first top semiconductor oxide portion 22A by the body region 32. The depth of the source region is greater than the second thickness t2, and is less than the first thickness t1.

Figure 23:
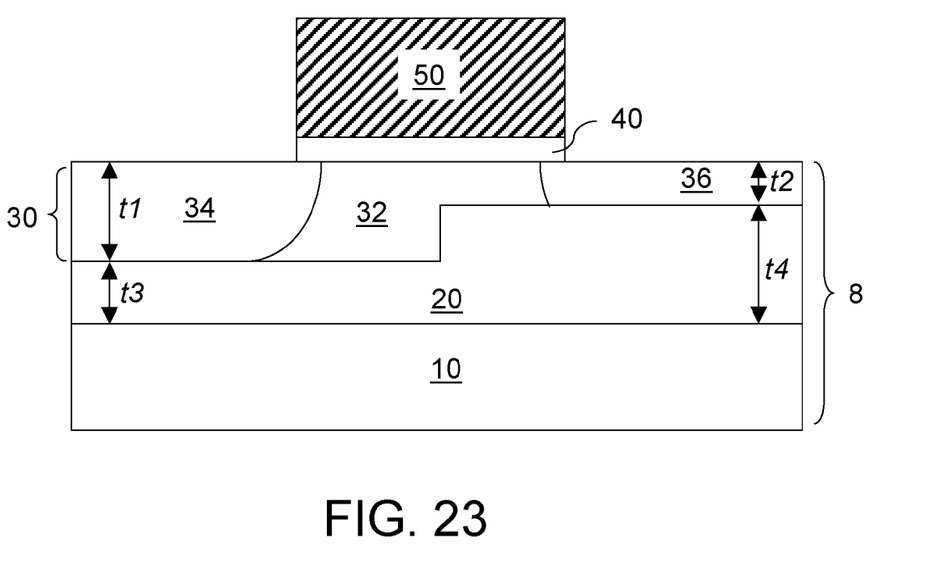

Referring to FIG. 23, a second variation of the second exemplary semiconductor structure is derived from the second exemplary semiconductor structure by omitting the processing step for formation of the semiconductor oxide layer illustrated in FIG. 18. Thus, the dielectric material layer 21 is formed directly on the semiconductor substrate 31 at a processing step corresponding to FIG. 19. In this case, the first top semiconductor portion and the second top semiconductor portion within the top semiconductor layer 30 laterally abut each other directly above the sidewall of the top semiconductor layer 30 abutting the buried insulator layer 20.

Figure 24:
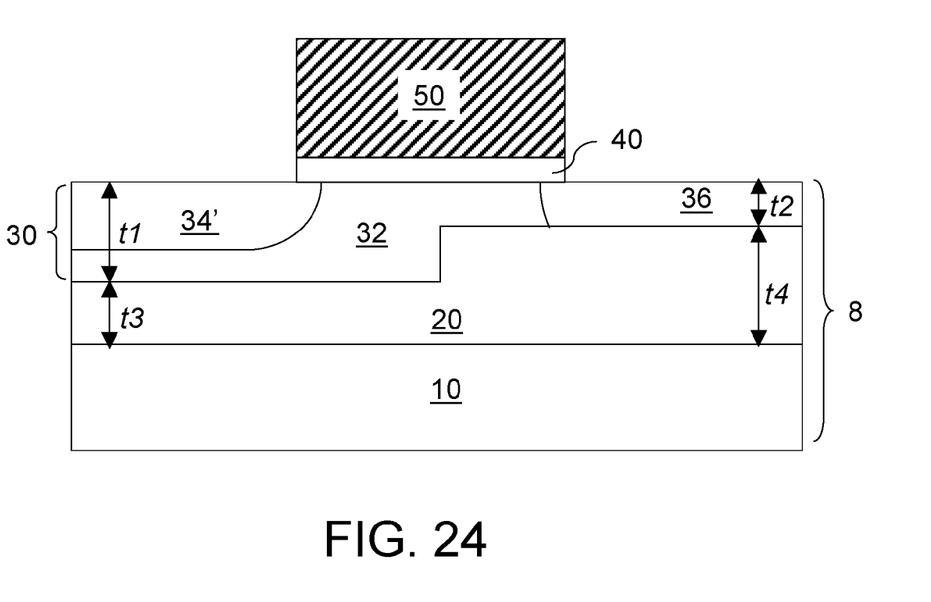

Referring to FIG. 24, a third variation of the second exemplary semiconductor structure is derived from the second exemplary semiconductor structure of FIG. 23 by modifying the ion implantation process employed to form the source region 34' in the same manner as in the first variation of the second exemplary semiconductor structure as illustrated in FIG. 22. The first top semiconductor portion and the second top semiconductor portion within the top semiconductor layer 30 laterally abut each other directly above the sidewall of the top semiconductor layer 30 that abuts the buried insulator layer 20. The source region 34' is separated from the first top semiconductor oxide portion 22A by the body region 32. The depth of the source region is greater than the second thickness t2, and is less than the first thickness t1.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a top semiconductor layer including a first top semiconductor portion having a first thickness and a second top semiconductor portion having a second thickness and laterally abutting said first top semiconductor portion, wherein said first thickness is greater than said second thickness;
    a field effect transistor comprising a body region, a first diffusion region, and a second diffusion region, wherein said body region includes a portion of said first top semiconductor portion and a portion of said second semiconductor portion;
    a buried insulator layer vertically abutting said top semiconductor layer, wherein said first diffusion region is located in said first top semiconductor portion, contacts said body region, and has said first thickness, and said second diffusion region has said second thickness;
    a handle substrate vertically abutting said buried insulator layer; and
    a spacer structure laterally abutting a sidewall of said buried insulator layer and having a different composition than said buried insulator layer.

2. The semiconductor structure of claim 1, wherein said first top semiconductor portion and said second top semiconductor portion comprise a same semiconductor material, are of integral construction, and have substantially coplanar top surfaces.

3. The semiconductor structure of claim 2, wherein an entirety of said first top semiconductor portion and said second top semiconductor portion are single crystalline.

4. The semiconductor structure of claim 1, wherein said buried insulator layer comprises a flat bottom surface vertically abutting an entirety of said handle substrate.

5. The semiconductor structure of claim 4, wherein said buried insulator layer comprises a first buried insulator portion having a third thickness and a second buried insulator portion having a fourth thickness, wherein fourth thickness is greater than said third thickness, wherein said first top semiconductor portion is located over an entirety of said first buried insulator portion, and wherein said second top semiconductor portion is located over said second buried insulator portion.

6. The semiconductor structure of claim 5, wherein said first top semiconductor portion vertically abuts an entirety of said first buried insulator portion and said second top semiconductor portion vertically abuts said second buried insulator portion.

7. The semiconductor structure of claim 1, further comprising a sidewall of said top semiconductor layer located at an edge of said first top semiconductor portion.

8. The semiconductor structure of claim 1, wherein said spacer structure comprises a semiconductor material, a metallic material, or an insulator material.

9. The semiconductor structure of claim 8, wherein an entirety of said first top semiconductor portion and said second top semiconductor portion are single crystalline, and wherein said spacer structure comprises a polycrystalline or amorphous semiconductor material.

10. The semiconductor structure of claim 1, wherein said first diffusion region is located in said first top semiconductor portion and is separated from said buried insulator layer by said body region, and said second diffusion region is located said second top semiconductor portion and abuts said buried insulator layer, wherein one of said first diffusion region and said second diffusion region is a source region and the other of said first diffusion region and said second diffusion region is a drain region.

11. The semiconductor structure of claim 1, further comprising a first semiconductor oxide portion and a second semiconductor oxide portion, wherein said first semiconductor oxide portion vertically abuts said first top semiconductor portion and said first buried insulator portion, and wherein said second semiconductor oxide portion vertically abuts said second top semiconductor portion and said second buried insulator portion.

12. The semiconductor structure of claim 1, wherein said body region has a doping of a first conductivity type, and said first and second diffusion regions have a doping of a second conductivity type that is the opposite of said first conductivity type.

13. A semiconductor structure comprising:
   a top semiconductor layer including a first top semiconductor portion having a first thickness and a second top semiconductor portion having a second thickness and laterally abutting said first top semiconductor portion, wherein said first thickness is greater than said second thickness;
   a field effect transistor comprising a body region, a first diffusion region, and a second diffusion region, wherein said body region includes a portion of said first top semiconductor portion and a portion of said second semiconductor portion;
   a buried insulator layer vertically abutting said top semiconductor layer, wherein said first diffusion region is located in said first top semiconductor portion, contacts said body region, and has said first thickness, and said second diffusion region has said second thickness; and
   a handle substrate vertically abutting said buried insulator layer, wherein said first diffusion region extends from a top surface of said first semiconductor portion to a planar top surface of a dielectric material, and said second diffusion region extends from a top surface of said second semiconductor portion to another planar surface of another dielectric material.

14. A semiconductor structure comprising:
   a top semiconductor layer including a first top semiconductor portion having a first thickness and a second top semiconductor portion having a second thickness and laterally abutting said first top semiconductor portion, wherein said first thickness is greater than said second thickness;
   a field effect transistor comprising a body region, a first diffusion region, and a second diffusion region, wherein said body region includes a portion of said first top semiconductor portion and a portion of said second semiconductor portion;
   a buried insulator layer vertically abutting said top semiconductor layer, wherein said first diffusion region is located in said first top semiconductor portion, contacts said body region, and has said first thickness, and said second diffusion region has said second thickness; and
   a handle substrate vertically abutting said buried insulator layer, wherein an entirety of a bottom surface of said first diffusion region contacts a dielectric material at a planar surface located at a depth of said first thickness from a top surface of said first diffusion region, and an entirety of a bottom surface of said other diffusion region contacts another dielectric material at a planar surface located at a depth of said second thickness from a top surface of said second diffusion region.

15. The semiconductor structure of claim 1, wherein said spacer structure comprises a semiconductor material or a metallic material.

* * * * *